United States Patent
Lee et al.

(10) Patent No.: US 7,138,844 B2
(45) Date of Patent: Nov. 21, 2006

(54) VARIABLE DELAY CIRCUITRY

(75) Inventors: Andy L. Lee, San Jose, CA (US); Gary Lai, Sunnyvale, CA (US); Changsong Zhang, Santa Clara, CA (US); Vaughn Betz, Toronto (CA); Ryan Fung, Mississauga (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/083,482

(22) Filed: Mar. 18, 2005

(65) Prior Publication Data

US 2006/0208785 A1    Sep. 21, 2006

(51) Int. Cl.
*H03H 11/26* (2006.01)
(52) U.S. Cl. ...................... 327/276; 327/261
(58) Field of Classification Search ............... None
See application file for complete search history.

(56) References Cited

U.S. PATENT DOCUMENTS

| | | | | |
|---|---|---|---|---|
| 4,714,924 A | * | 12/1987 | Ketzler | 340/825.21 |
| 4,805,195 A | * | 2/1989 | Keegan | 375/354 |
| 5,376,849 A | * | 12/1994 | Dickol et al. | 327/278 |
| 6,453,402 B1 | * | 9/2002 | Jeddeloh | 711/167 |
| 6,674,314 B1 | * | 1/2004 | Takai | 327/158 |
| 2002/0015460 A1 | * | 2/2002 | Bhullar et al. | 375/371 |
| 2002/0079937 A1 | * | 6/2002 | Xanthopoulos | 327/158 |
| 2002/0178391 A1 | * | 11/2002 | Kushnick | 713/500 |
| 2003/0001650 A1 | * | 1/2003 | Cao et al. | 327/277 |
| 2004/0155690 A1 | * | 8/2004 | Andrews et al. | 327/276 |
| 2004/0239387 A1 | * | 12/2004 | Zhang et al. | 327/158 |
| 2005/0046458 A1 | | 3/2005 | Schroeder et al. | |

FOREIGN PATENT DOCUMENTS

EP    0 704 975    4/1996
EP    0 863 612    9/1998

* cited by examiner

*Primary Examiner*—Timothy P. Callahan
*Assistant Examiner*—Cassandra Cox
(74) *Attorney, Agent, or Firm*—Fish & Neave IP Group of Ropes & Gray LLP; Robert R. Jackson

(57) ABSTRACT

Circuitry for providing an input data signal to other circuitry on an integrated circuit includes a course delay chain and a fine delay chain. These two delay chains are cascadable, if desired, to provide a very wide range of possible amounts of delay which can be finely graded by use of the fine delay chain.

21 Claims, 3 Drawing Sheets

VARIABLE DELAY CIRCUITRY

BACKGROUND OF THE INVENTION

This invention relates to variable delay circuitry, and more particularly to delay circuitry that is programmable with respect to the amount of signal delay provided.

Programmable logic devices ("PLDs") are an example of circuitry in which it is helpful to include variable delay circuitry. Such circuitry in a PLD may be used to adjust the delay between the arrival of an input data signal on the device and delivery of that data signal to core (e.g., programmable logic) circuitry of the device. The input data signal may or may not be registered in an input/output ("I/O") cell of the device, and from the I/O cell the data signal may be registered or not registered when it reaches the core of the device. The data signal may need to be delayed in the course of this handling to improve its timing relative to other signals on the device (e.g., clock signals). How the signal is used (e.g., whether and where it is registered) can affect how much and how precisely the data signal needs to be delayed. Some uses of the data signal may need relatively large amounts of delay, but within a relatively broad range of acceptable values. Other uses of the data signal may need only relatively small amounts of delay, but with greater precision. Still other uses of the data signal may need large amounts of delay and precision with regard to that delay.

SUMMARY OF THE INVENTION

In accordance with this invention, circuitry for delaying a signal by a selectable amount of delay may include first circuitry for delaying the signal by a selectable number of relatively large increments of delay and second circuitry for additionally delaying the signal by a selectable number of relatively small increments of delay. In various embodiments the first and second circuitries can be used separately, or the first and second circuitries can be cascaded (used in series). In the cascaded case, the circuitry allows precise control of the overall signal delay over a large or wide range of possible overall signal delay. The wide range is provided (for the most part) by the first circuitry, while the precision is provided by the second circuitry.

Further features of the invention, its nature and various embodiments, will be more apparent from the accompanying drawing and the following detailed description.

DETAILED DESCRIPTION

Figure 1:
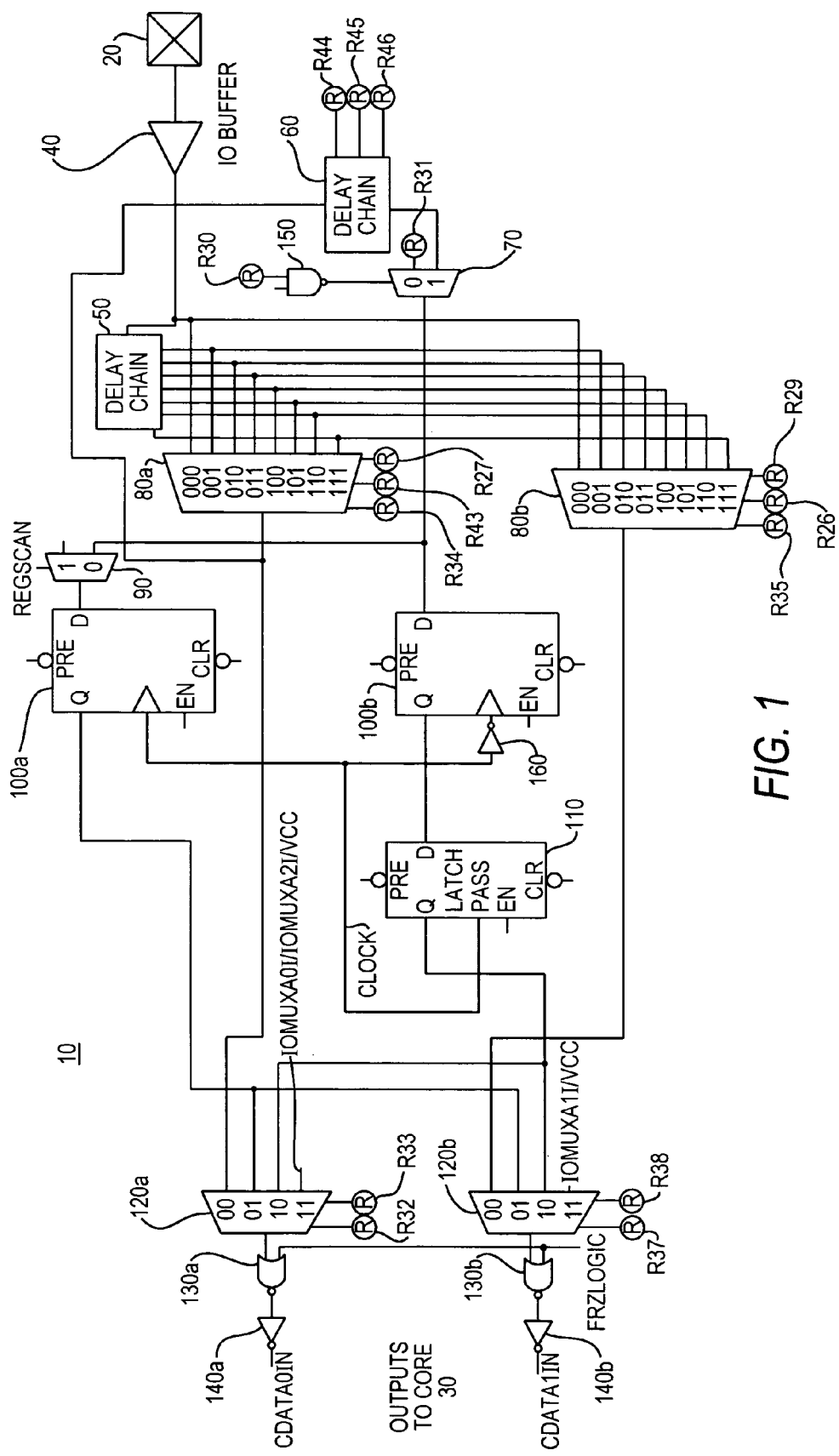
FIG. 1 is a simplified schematic block diagram of an illustrative embodiment of circuitry constructed in accordance with the invention.

The illustrative delay circuitry shown in FIG. 1 is included in an input/output ("I/O") cell or module 10 in a programmable logic device ("PLD"), although other uses of the circuitry are also possible. Because the delay circuitry is only used in connection with handling an input signal, only the input signal handling portion of I/O cell 10 is shown in FIG. 1. This I/O cell circuitry is connected between an I/O pin or pad 20 of cell 10 and the core circuitry 30 of the PLD. The depicted circuitry can be used to convey an input signal from pad 20 to core 30 in any of several different ways. Moreover, the manner in which the input signal is conveyed to core 30 as CDATA0IN can be the same as or different from the manner in which the input signal is conveyed to core 30 as CDATA1IN.

The circuitry shown in FIG. 1 includes the following elements: (1) I/O buffer 40, (2) coarse delay chain 50, (3) fine delay chain 60, (4) multiplexers 70, 80a, 80b, 90, 120a, and 120b, (5) registers 100a and 100b, (6) latch 110, NOR gates 130a and 130b, (7) inverters 140a and 140b, (8) NAND gate 150, and (9) inverter 160.

Delay chain 50 is called the coarse delay chain because the increments of delay between its output taps (described in more detail below) are greater than the increments of delay that fine delay chain 60 can be controlled to produce. For example, fine delay chain 60 may have eight different amounts of delay that can be selected by programmable control of RAM bits R44–R46. These different amounts of delay are preferably equally spaced apart in time, the spacing being referred to as a fine increment. Coarse delay chain 50 may also have eight different amounts of delay that it can produce (e.g., in conjunction with multiplexer 80a as discussed in more detail below). These different amounts of delay are also preferably equally spaced apart in time, the spacing in this case being referred to as a coarse increment. In an especially preferred embodiment the sum of eight fine increments is approximately equal to one coarse increment. This makes as many as 64 finely spaced amounts of delay available when, as is possible with the circuitry of this invention, the coarse and fine delay chains 50 and 60 are cascaded (i.e., coarse delay chain 50 is connected in series with fine delay chain 60). To generalize this point somewhat, each coarse increment is especially preferred to be equal to 2 to the N times a fine increment (where N is any positive, non-zero integer). This type of relationship between the coarse and fine increments is desirable for efficiency in coding of delay selection control signals.

Considering the circuitry of FIG. 1 now in more detail, the data input signal applied to pad 20 is buffered by buffer 40. The output signal of buffer 40 may be considered the first (zero delay) output of coarse delay chain 50. This signal is applied to the remainder of delay chain 50 and also to what may be called the first input terminal of each of multiplexers 80a and 80b. These first input terminals are labeled 000 in FIG. 1. Delay chain 50 delays the signal applied to it by seven successive coarse increments of delay. The signal is output on one of the taps of delay chain 50 after each of these coarse delay increments. For example, after the first increment the signal is applied to the second input terminal (labeled 001) of each of multiplexers 80a and 80b. After two increments the signal is applied to the third input terminal (labeled 010) of each of multiplexers 80a and 80b. This progression continues until after seven increments the signal is applied to the eighth input terminal (labeled 111) of each of multiplexers 80 and 80b.

Multiplexer 80a is controllable by programming of RAM bits R27, R43, and R34 to select any one of its input signals to be its output signal. Multiplexer 80b operates similarly in response to programmable RAM bits R29, R28, and R35. The input signal selection made by multiplexer 80a can be the same as or different from the input signal selection made by multiplexer 80b.

The output signal of multiplexer 80a is applied to fine delay chain 60 and also to the first input terminal (labeled 00) of multiplexer 120*a*. The output signal of multiplexer 80*b* is applied to the first (00) input terminal of multiplexer 120*b*.

Fine delay chain 60 can delay the signal applied to it by any of eight finely incremented amounts of delay as described earlier in this specification. The amount of delay introduced by fine delay chain 60 is controlled by how RAM bits R44–R46 are programmed as described above. For example, the values programmed into RAM bits R44–R46 may control the speed at which a signal propagates through delay chain 60.

The output signal of fine delay chain 60 is applied to one input terminal (the terminal labeled 1) of multiplexer 70. Multiplexer 70 can be controlled by the output signal of NAND gate 150 to select the signal from delay chain 60 to be the output signal of the multiplexer.

The output signal of multiplexer 70 is applied to one input terminal (the terminal labeled 0) of multiplexer 90 and to the D input terminal of register or flip-flop 100*b*. Multiplexer 90 is controllable by its RegScan input signal to select the signal from multiplexer 70 for application to the D input terminal of register or flip-flop 100*a*.

The Q output signal of register 100*a* is applied to the second input terminal (labeled 01) of each of multiplexers 120*a* and 120*b*. The Q output signal of register 100*b* is applied to the D input terminal of latch circuit 110. The Q output signal of latch 110 is applied to the third input terminal (labeled 10) of each of multiplexers 120*a* and 120*b*. Register 100*a* is clocked by rising edges in the depicted clock signal. Register 100*b* is clocked by falling edges in the clock signal (the clock signal being inverted by inverter 160 for application to register 100*b*). Rising edges in the clock signal also enable latch circuit 110 to pass (from D to Q) the signal applied to the latch circuit. The purpose of latch 110 is to synchronize the outputs of registers 100*a* and 100*b* so that the outputs to multiplexers 120*a* and 120*b* will change on the rising edge of the clock signal. Registers 10*a* and 100*b* can be used together as double data rate ("DDR") registers to drive core 30 through CDATA0IN and CDATA1IN simultaneously. Because registers 120*a* and 120*b* are respectively clocked by the rising and falling edges of the clock signal to acquire two data inputs in one clock cycle, these two data inputs must be lined up on the rising edge of the clock signal before they are sent to PLD core circuitry 30. That is the purpose of latch 110.

The fourth input to multiplexer 120*a* can be a fixed signal such as VCC. The same is true for the fourth input to multiplexer 120*b*.

Multiplexer 120*a* is controlled by programmable RAM bits R32 and R33 to select one of its input signals to be its output signal. Multiplexer 120*b* is similarly programmably controlled by RAM bits R37 and R38. Multiplexers 120*a* and 120*b* can select the same signals to output, or they can select different signals.

When NOR gates 130*a* and 130*b* are enabled by the FRZLOGIC signal, they pass the output signals of their respective multiplexers via their respective inverters 140*a* and 140*b* to PLD core circuitry 30.

From the foregoing it will be apparent that the input signal from pad 20 can be applied to core 30 in a number of different ways, including (1) with or without registration and/or (2) with or without delay. If delay is employed, the delay can be coarse only, fine only, or fine cascaded with coarse. Examples of these various options are considered in the next paragraphs.

Considering first the possibilities available from multiplexer 120*a*, if an unregistered signal is desired, multiplexer 120*a* is programmably controlled to select the signal from its first (00) input terminal to be its output signal. This signal can have any amount of coarse delay (including no coarse delay), as selected by the programmable control of multiplexer 80*a*. If a registered signal is desired from multiplexer 120*a*, the second (01) input to multiplexer 120*a* can be selected. If the second input is selected, the registered signal comes from register 100*a*, and the signal can have any amount of cascaded coarse and fine delay (including zero delay) as a result of passage through some or all of elements 50, 80*a*, and 60 prior to reaching register 100*a*. Any desired coarse delay amount (including zero coarse delay) is provided and selected by elements 50 and 80*a*. Added to this coarse amount of delay is any desired fine delay amount (including zero fine delay) provided by element 60 as controlled by RAM bits R44–R46. The third input to multiplexer 120*a* may be selected in the event that DDR operation is desired. Again, the signal can have any amount of coarse and/or fine delay. The delay is the same, and is produced in the same way, as the above-described delay of the signal going to register 100*a*.

The final possibility from multiplexer 120*a* results from selection of its 11 input signal.

Turning now to the possibilities for the output signal from multiplexer 120*b*, the first possibility (selectable by programming multiplexer 120*b* to output the signal applied to its 00 input terminal) is the unregistered output from multiplexer 80*b*. This is a signal which can be delayed by any number of the coarse delay increments (including zero increments) available from coarse delay chain 50. The number of increments used is selected by the programmable control of multiplexer 80*b*. This is therefore the same kind of signal as is available from selection of the first (00) input to multiplexer 120*a*, but the amounts of delay selected by multiplexers 80*a* and 80*b* may be the same as or different from one another.

The second and third possibilities from multiplexer 120*b* are the same as the second and third possibilities from multiplexer 120*a* because the 01 and 10 inputs to both of these multiplexers are the same.

The fourth possibility from multiplexer 120*b* results from selection of its 11 input signal.

The few signals and elements in FIG. 1 that have not been described are not significant to operation of the circuitry in accordance with the invention. For example, the FRZ-LOGIC signal and associated circuitry are provided for such purposes as initiating operation of the circuitry in a controlled way. The RegScan signal and associated circuitry are provided so that registers can be operated in a scan chain during certain kinds of testing. Elements 70 and 150 are used for performing a synchronous clear of registers 100*a* and 100*b*. The unlabeled input to NAND gate 150 is an SCLR signal. This function is selectively enabled by RAM bit R30. Assuming that this function is enabled, then when the SCLR signal is asserted, it will set the registers to the value specified by RAM bit R31 (1 or 0) on the next clock cycle.

Figure 2:
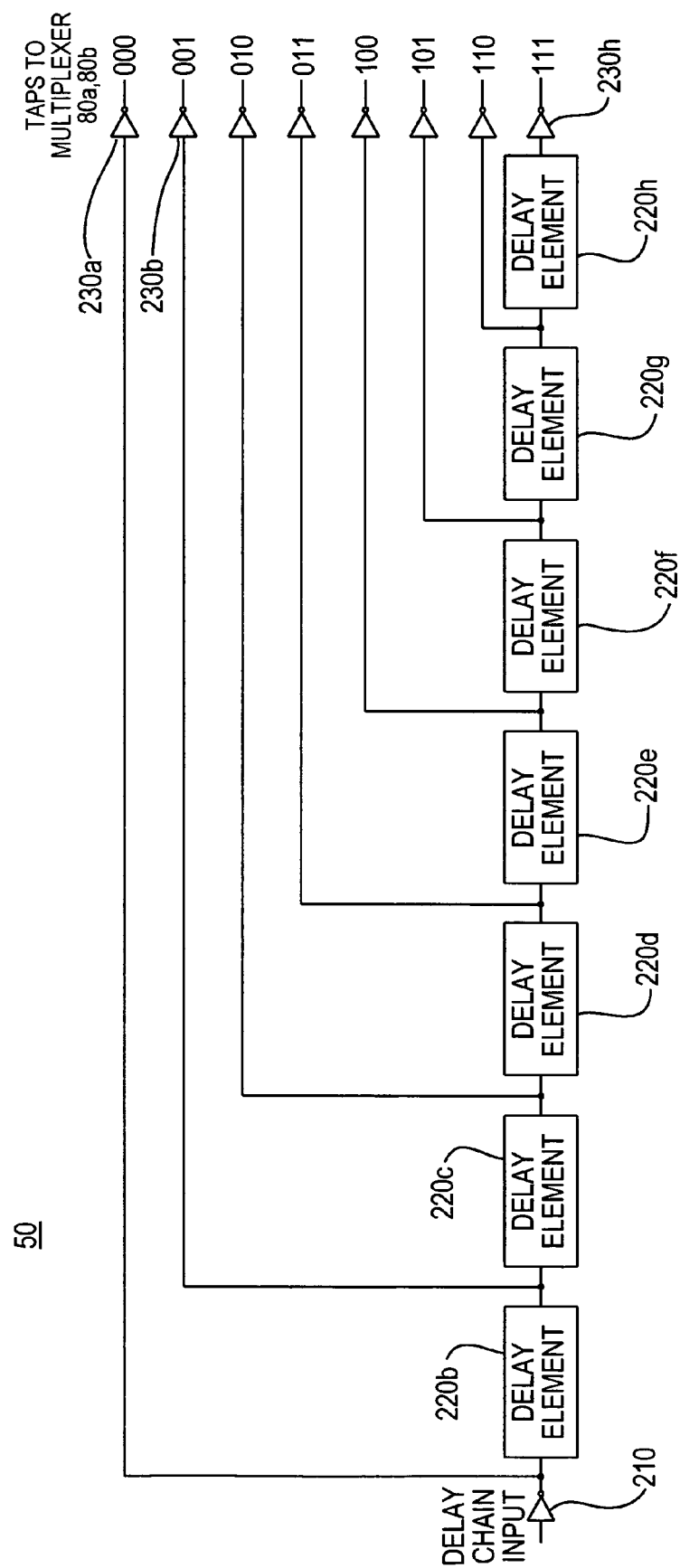
FIG. 2 is a more detailed, but still simplified, schematic block diagram of an illustrative construction of certain portions of the FIG. 1 circuitry.
Figure 3:
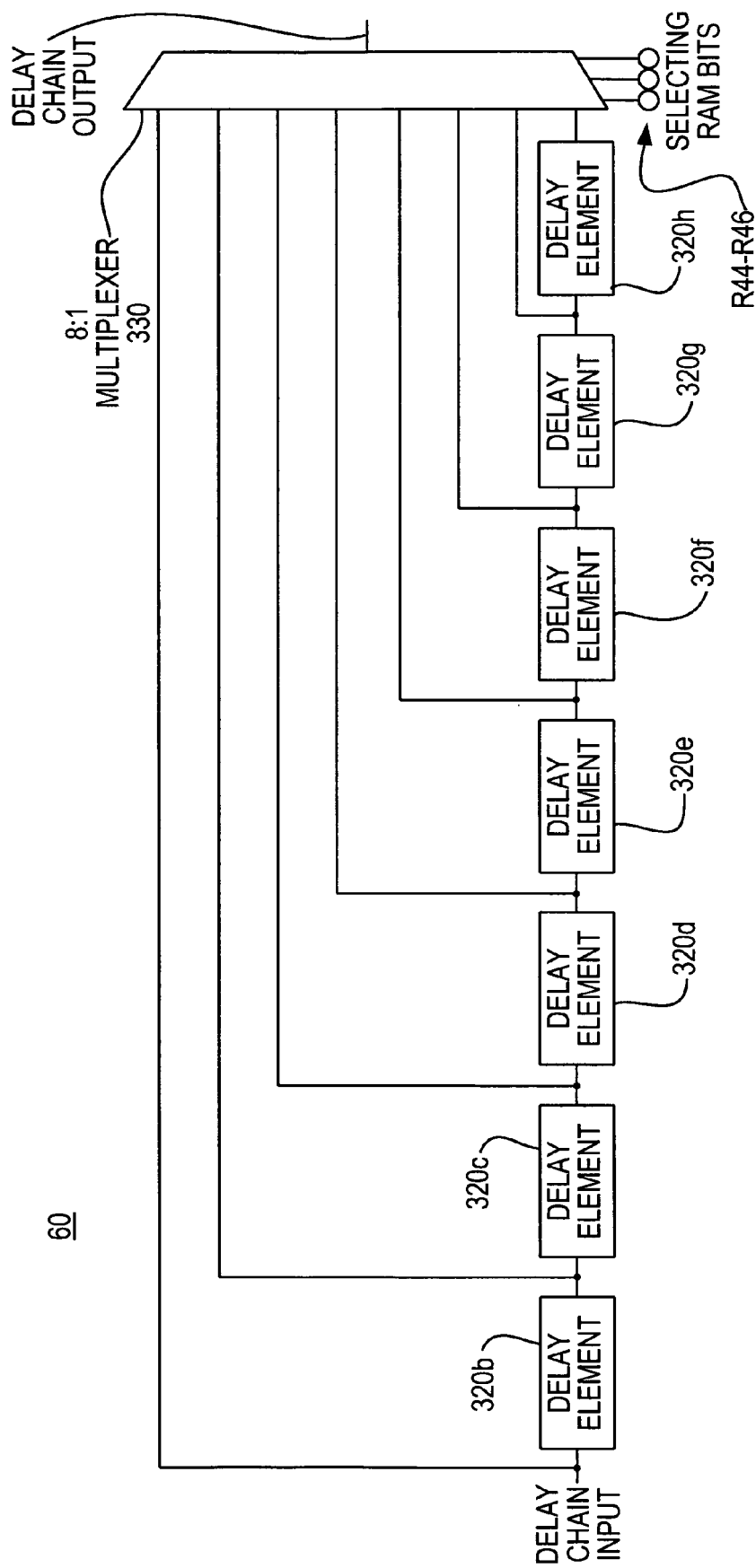
FIG. 3 is a more detailed, but still simplified, schematic block diagram of an illustrative construction of certain other portions of the FIG. 1 circuitry.

Although delay chains 50 and 60 can be constructed in many different ways, an illustrative construction of coarse delay chain 50 is shown in FIG. 2, and an illustrative construction of fine delay chain 60 is shown in FIG. 3. In FIG. 2 the delay chain input signal (from I/O buffer 40 in FIG. 1) is inverted by inverter 210. The output signal of inverter 210 is applied to inverter 230*a* and to a series of delay circuit elements 220*b*–220*h*. Each delay element 220 adds one coarse increment of delay to the signal propagating through it. The output signal of each delay element 220 is applied to a respective one of inverters 230*b*–230*h*. The outputs of inverters 230a–230h are respectively the 000–111 inputs to multiplexers 80a and 80b (FIG. 1).

In FIG. 3 the delay chain input (from multiplexer 80a in FIG. 1) is applied to one input of multiplexer 330 and to a series of delay circuit elements 320b–320h. Each delay element 320 adds one fine increment of delay to the signal propagating through it. The output signal of each delay element 320 is applied to a respective further input to multiplexer 330. RAM bits R44–R46 (FIG. 1) select which one of its inputs multiplexer 330 will output. The output of multiplexer 330 goes to multiplexer 70 in FIG. 1.

It is desirable for the delay chain circuitry 50/60 to have the smallest possible intrinsic (unavoidable) delay. It should be possible for the 000 control setting of the delay chain circuitry to have zero delay. If it does not, all other settings will have this same non-zero delay added on to them to maintain equal-amount increments.

It will be understood that the foregoing is only illustrative of the principles of the invention, and that various modifications can be made by those skilled in the art without departing from the scope and spirit of the invention. For example, the sizes (absolute and relative) and available numbers of the coarse and fine delay increments can be different than in the above-described illustrative embodiment. Similarly, the particular choices of signals that can be output via multiplexers 120a and 120b can be different than those shown and described above. The order of the coarse and fine delay chains in circuitry for cascading those chains can be different than is shown in FIG. 1. For example, the fine delay chain can precede the coarse delay chain in circuitry for cascading those chains.

The invention claimed is:

1. Circuitry for delaying a signal by a selectable amount of delay comprising:
   first circuitry for delaying the signal by a selectable number of relatively large increments of delay;
   second circuitry for additionally delaying the signal by a selectable number of relatively small increments of delay;
   register circuitry for registering the signal after it has been processed by the first and second circuitry; and
   multiplexer circuitry for selecting as an output either the signal after it has been processed by the first circuitry or after it has been registered by the register circuitry.

2. The circuitry defined in claim 1 wherein the large increments are all substantially equal amounts of delay.

3. The circuitry defined in claim 2 wherein the small increments are all substantially equal amounts of delay.

4. The circuitry defined in claim 3 wherein each of the large increments is approximately equal to a plural integer number of the small increments.

5. The circuitry defined in claim 3 wherein each of the large increments is equal to 2 to the N times one of the small increments, where N is a non-zero, positive integer.

6. The circuitry defined in claim 1 wherein the first circuitry is programmable to select the selectable number of relatively large increments of delay.

7. The circuitry defined in claim 1 wherein the second circuitry is programmable to select the selectable number of relatively small increments of delay.

8. The circuitry defined in claim 7 wherein the first circuitry produces an intermediate signal that is delayed by the selectable number of relatively large increments of delay, and wherein the second circuitry operates on the intermediate signal to additionally delay that signal by the selectable number of relatively small increments of delay.

9. The circuitry defined in claim 1 wherein the first circuitry comprises:
   delay chain circuitry having a plurality of taps; and
   multiplexer circuitry for selecting one of the taps to delay the signal by the selectable number of relatively large increments of delay.

10. The circuitry defined in claim 1 wherein the second circuitry comprises:
    delay chain circuitry having selectable signal propagation speed.

11. The circuitry defined in claim 1 further comprising:
    second register circuitry for registering the signal after it has been processed by the first and second circuitry, the second register circuitry being clocked by a clock signal that is inverted relative to a clock signal used to clock the register circuitry.

12. The circuitry defined in claim 11 further comprising:
    multiplexer circuitry for selecting as an output signal one of (1) the signal after it has been processed by the first circuitry, (2) the signal after it has been registered by the register circuitry, and (3) the signal after it has been registered by the second register circuitry.

13. The circuitry defined in claim 12 further comprising:
    third circuitry for delaying the signal by a second selectable number of the relatively large increments.

14. The circuitry defined in claim 13 further comprising:
    second multiplexer circuitry for selecting as a second output signal one of (1) the signal after it has been processed by the third circuitry, (2) the signal after it has been registered by the register circuitry, and (3) the signal after it has been registered by the second register circuitry.

15. Input circuitry for a PLD comprising:
    delay circuitry for selectively delaying an input signal by a selectable member of relatively large delay increments and a selectable number of relatively small increments;
    register circuitry for registering the signal after it has been processed by the delay circuitry; and
    selection circuitry for selecting as an output signal one of (1) the signal after it has been processed by the delay circuitry and (2) the signal after it has been registered by the register circuitry.

16. The input circuitry defined in claim 15 further comprising:
    second register circuitry for registering the signal after it has been processed by the delay circuitry, wherein the second register circuitry is clocked by a clock signal that is inverted relative to a clock signal used to clock the register circuitry.

17. The input circuitry defined in claim 16 wherein the selection circuitry is additionally able to select the output signal as (3) the signal after it has been registered by the second register circuitry.

18. The input circuitry defined in claim 16 further comprising:
    second delay circuitry for delaying the signal by a second selectable number of the relatively large delay increments; and
    second selection circuitry for selecting as a second output signal one of (1) the signal after it has been processed by the second delay circuitry, (2) the signal after it has been registered by the register circuitry, and (3) the signal after it has been registered by the second register circuitry.

19. Circuitry for delaying a signal by a selectable amount of delay comprising:

first delay chain circuitry for outputting the signal in a plurality of forms, each of the forms having a different number of relatively large delay increments relative to the signal;

selection circuitry for selecting one of the forms as an intermediate signal;

second delay chain circuitry for delaying the intermediate signal by a selectable number of relatively small delay increments to produce a finally delayed signal;

register circuitry for registering the finally delayed signal; and second selection circuitry for selecting as an output either the finally delayed signal or the finally delayed signal after registration by the register circuitry.

20. The circuitry defined in claim 19 wherein the selection circuitry is programmable with respect to which of the forms is selected.

21. The circuitry defined in claim 19 wherein the second delay chain circuitry is programmable with respect to the number of the relatively small delay increments.

* * * * *